United States Patent [19]

Hayashi et al.

[11] Patent Number: 5,136,540
[45] Date of Patent: Aug. 4, 1992

[54] NON-VOLATILE SEMICONDUCTOR MEMORY FOR VOLATILEY AND NON-VOLATILEY STORING INFORMATION AND WRITING METHOD THEREOF

[75] Inventors: Yutaka Hayashi, Tsukuba; Yoshikazu Kojima, Tokyo; Ryoji Takada, Tokyo; Masaaki Kamiya, Tokyo, all of Japan

[73] Assignees: Agency of Industrial Science and Technology; Seiko Instruments Inc., both of Japan

[21] Appl. No.: 491,945

[22] Filed: Mar. 12, 1990

[30] Foreign Application Priority Data

Mar. 10, 1989 [JP] Japan .................... 1-58174

[51] Int. Cl.$^5$ .................. G11C 11/34; H01L 29/68
[52] U.S. Cl. ................... 365/185; 357/23.5; 357/23.6
[58] Field of Search ........... 365/185, 184; 357/23.5, 357/23.12, 23.7, 4, 6, 23.6

[56] References Cited

U.S. PATENT DOCUMENTS

| | | | |
|---|---|---|---|
| 4,297,719 | 10/1981 | Hsu | 357/23.7 |
| 4,491,859 | 1/1985 | Hijiya et al. | 357/23.7 |
| 4,532,535 | 7/1985 | Gerber et al. | 357/6 |
| 4,590,504 | 5/1986 | Guterman | 357/4 |
| 4,672,580 | 6/1987 | Yau et al. | 357/23.5 |
| 4,683,554 | 7/1987 | Lockwood et al. | 365/185 |
| 4,729,115 | 3/1988 | Kauffmann et al. | 365/185 |
| 4,780,750 | 10/1988 | Nolan et al. | 357/23.5 |
| 4,807,003 | 2/1989 | Mohammadi et al. | 357/23.5 |
| 4,866,493 | 9/1989 | Arima et al. | 357/23.5 |
| 4,907,198 | 3/1990 | Arima | 357/23.5 |
| 4,912,749 | 3/1990 | Maruyama et al. | 357/23.5 |
| 4,924,278 | 5/1990 | Logie | 357/23.5 |
| 4,988,635 | 1/1991 | Ajika et al. | 357/23.5 X |
| 4,989,054 | 1/1991 | Arima et al. | 357/23.5 |
| 5,033,023 | 7/1991 | Hsia et al. | 357/23.5 |
| 5,065,201 | 11/1991 | Yamauchi | 357/23.5 |

Primary Examiner—Stuart N. Hecker
Assistant Examiner—Michael A. Whitfield
Attorney, Agent, or Firm—Bruce L. Adams; Van C. Wilks

[57] ABSTRACT

A nonvolatile memory has integrated memory cells each operative to carry out writing and reading of information on a random-access basis and each having an electric charge storage structure effective to memorize the information in a nonvolatile state. The information is temporarily written into each memory cell in a volatile state, and thereafter the temporarily written information is written at once into a respective electric charge storage structure of each memory cell, thereby effecting high speed writing of nonvolatile information into the respective memory cells.

21 Claims, 2 Drawing Sheets

NON-VOLATILE SEMICONDUCTOR MEMORY FOR VOLATILEY AND NON-VOLATILEY STORING INFORMATION AND WRITING METHOD THEREOF

BACKGROUND OF THE INVENTION

The present invention relates to a nonvolatile memory which can store information even when the power supply is turned off, and relates to the method of writing such a nonvolatile memory.

There have been proposed various types of conventional nonvolatile memory elements (memory cells) such as MAOS type, FAMOS type, MIOS type and so on. These memories have different structures with regard to each other. For example, to make an electric charge storage structure for nonvolatile storing of logic information in the form of electric charge, an electro-conductive film buried in an electrically insulating layer (i.e. floating gate) can be used. Or, multilayers of dielectric materials and ferroelectric film can be utilized. Further, there have been various injection and extraction methods of selectively injecting and extracting electric charge into and from the electric charge storage structure in order to change the charged state of the storage structure. These methods include avalanche injection, tunnel injection, channel injection, and tunnel extraction of electric charge from the electric charge storage structure to change the charged state to the opposite polarity of the extracted electric charge.

The charged state of individual memory cells can be erased concurrently by irradiation of ultraviolet light or X-ray. Further, by a suitable combination of these electric charge injection and extraction methods, one polarity type of electric charge is restored into or extracted from the storage structure which has stored the other polarity type of electric charge to enable electrical erasing and rewriting of memorized contents. These types of memories are called EAROM and $E^2$ PROM.

A semiconductor region is formed in opposed relation to the electric charge storage structure, or an insulating gate region is electrically coupled to the electric charge storage structure, for use in feeding electric charge to be injected into the electric charge storage structure and for use in receiving electric charge extracted from the storage structure.

Moreover, in practical IC devices, these various types of nonvolatile memory elements (memory cells) are combined with a static RAM cell so as to perform the function of RAM (random access memory ). Very recently, it has been proposed in Japanese Patent Application No. 4635/1987 that a change of the surface potential of the forementioned semiconductor region can be utilized for random-access writing or temporary writing prior to nonvolatile writing.

This random-access writing method is conventionally applied to the nonvolatile memory cell; however, when carrying out random-access reading without effecting nonvolatile writing, the information is automatically erased. Moreover, the smaller the size of the memory cell, the smaller the read signal which causes a serious drawback. Further, according to this conventional method, when the memory cell has a relatively low efficiency of the electric charge capture in the storage structure, the S/N ratio of the signal representative of the nonvolatile memory contents becomes worse, thereby making commercial use difficult.

SUMMARY OF THE INVENTION

An object of the invention is to provide a memory which can be used as a volatile memory (RAM) and nonvolatile memory (ROM) and which can avoid the erasing of information even after carrying out random-access reading, and also to provide a method of writing such memory.

In order to realize the object of the present invention, the semiconductor nonvolatile memory is comprised of integrated memory cells, each memory cell comprising a first semiconductor region having a first surface, an electric charge storage structure disposed on the first surface for storing electric charge, a first control gate region electrically coupled to the electric charge storage structure, a second region electrically connected to the first surface, a second gate electrically coupled to either of the electric charge storage structure and the first control gate region, and random-access potential setting means provided to connect to the first control gate region for setting a random-access potential thereto.

Further, according to the present invention, in the semiconductor nonvolatile memory having memory cells connected in array, the following nonvolatile writing method is employed so as to instantly write multi-bit information in the nonvolatile state. Namely, the writing method of the semiconductor nonvolatile memory is comprised of the step of volatilely and temporarily setting or writing a given potential to the first gate of each memory cell through the random-access potential setting means prior to applying a given voltage to the second gate of each memory cell to effect nonvolatile writing, and the step of thereafter applying at once a nonvolatile writing voltage, according to a nonvolatile writing instruction, to the respective second gate of each memory cell to be written with information so as to nonvolatilely write temporarily written information in a form of the set potential into the respective electric charge storage structure of each memory cell.

The expression "electrically coupled" means that the first control gate region and the electric charge storage structure are capacitively coupled to each other, or that the first control gate region is constructed to apply an electric field to the electric charge storage structure. The expression "electrically connected second region" means that, when the first semiconductor region is composed of a channel of the buried type, the second region is a region in ohmic contact with the first semiconductor region, or that, when an inverted region is formed on the first semiconductor region, the second region is a region effective to exchange a carrier to and from the inverted channel. In most cases, the second region is composed of a semiconductor region, and in some cases, a region composed of metal or silicide may function as the second region.

Further, the electric charge storage structure can be formed of a multi-layer structure of dielectric films, an electro-conductive material buried in an insulating layer, or ferroelectric material. When the electro-conductive material extends horizontally outside the first surface of the first semiconductor region, the first control gate region is not necessarily disposed over the surface of the first semiconductor region, but may be capacitively coupled to the electroconductive material through an insulating film. Further in case that the electric charge storage structure is composed of a multi-layer dielectric material or ferroelectric film, the second gate is disposed on the first surface of the first semiconductor through an insulating film or the electric charge storage structure. According to a potential given to the second gate, a potential of the semiconductor surface of the first semiconductor region and an electric field of the electric charge storage structure or an electric field of an insulating film in contact with the storage structure can be controlled to effect the injection and extraction of electric charge into and from the electric charge storage structure. Namely, the charged state of the storage structure can be changed.

Further, the random-access potential setting means can be composed of a switching element such as a diode and a transistor connected to the first control gate region and has the function to set the potential of the first control gate region according to information to be written and thereafter to maintain temporarily the set potential for a duration. Further, the random-access potential setting means may include an additional element such as a transistor or a diode having the function to select a floating state or fixed potential state of the first control gate region. The time needed for setting the potential is less than the time needed for carrying out nonvolatile writing. Consequently, information can be quickly set to each memory cell just prior to carrying out the nonvolatile writing. When carrying out the nonvolatile writing, the volatile or temporary information just set in each memory cell is transferred into the corresponding storage structure of each cell at once as the nonvolatile information. Therefore, according to the present invention, information can be instantly written into each cell in the nonvolatile state.

Further, the switching element such as a diode or a transistor is connected to a volatile information input gate, and this switching element is used as the random-access potential setting means so as to write volatile information into the volatile information input gate. Then the volatile information is written into the first control gate region according to the information at the volatile information input gate. Thus when applying a high voltage to the second gate, electric charge is injected into or released from the electric charge storage structure correspondingly to the volatile information to thereby write the information in the nonvolatile state.

DESCRIPTION OF EMBODIMENTS

Figure 1:
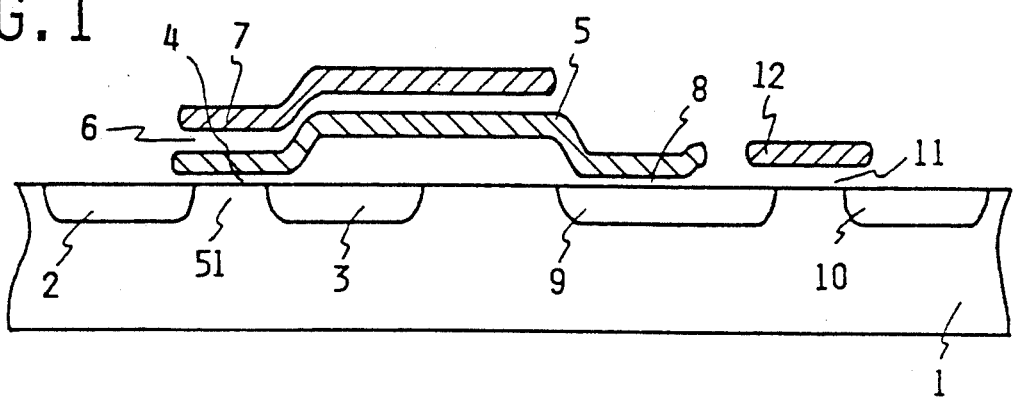
FIG. 1 is a sectional view of a memory cell which constitutes a first embodiment of the semiconductor nonvolatile memory according to the present invention.

Hereinafter, the inventive nonvolatile memory and the writing method thereof will be described in conjunction with the drawings of memory cells which constitute the nonvolatile memory. FIG. 1 is a sectional view of a single cell of a first embodiment of the inventive semiconductor nonvolatile memory. An $N^+$ type source region 2 and drain region 3 are formed on a surface of a P type silicon substrate 1 in spaced relation from each other to function as the second region (In this embodiment, the second region is comprised of two sections.). Further, a first semiconductor region 51 is defined on a surface portion of the substrate 1 between the source region 2 and the drain region 3. A floating gate 5 is formed on the first semiconductor region 51 through a gate oxide film 4. A second gate 7 is formed on the floating gate 5 through a second gate insulating film 6, and an $N^+$ type first control gate region 9 is formed under the floating gate through a first control gate region insulating film 8 in a surface portion of the substrate 1. The second gate 7 and first control gate region 9 are strongly capacitively coupled to the floating gate 5 so as to control a potential of the floating gate 5.

The description is next given for the writing method according to the present invention. A switching transistor is formed to operate as a random-access potential setting means and is comprised of the first control gate region 9, a volatile information input region 10 disposed in spaced relation from the first control gate region 9, and a volatile information input gate 12 formed on a gate oxide film 11. A potential of the first control gate region 9 is set according to a potential of the volatile information input region 10 in response to a signal to the volatile information input gate 12. Namely, volatile information can be written in the first control gate region 9 in the form of the set random-access potential. For example, under the state that the volatile information input gate 12 is applied with a voltage exceeding a threshold voltage of the transistor, when a voltage 0 V (equal to the potential of the substrate 1) is applied to the volatile information input region 10, the potential of 0 V is set in the first control gate region 9. On the other hand, if 5 V of the power supply voltage is applied to the volatile information input region 10, about 5 V of the potential is set in the first control gate 9 as the volatile information. Thereafter, the potential of the volatile information input gate 12 is switched to 0 V to turn off the transistor such that the volatile information is temporarily held in the first control gate region 9 for several milliseconds.

Next, the description is given for the method of converting the volatile information written in the first control gate region 9 into the corresponding nonvolatile information in the floating gate 5. A potential of the drain region 3 is set to 0 V and the second gate 7 is applied with a high voltage of more than 10 V. The gate oxide film 4 is entirely or partly formed of a tunnel oxide film of about 50Å. Therefore, by holding the second gate 7 at the high voltage, the floating gate 5 is held at a high voltage through the capacitive coupling such that a high electric field is applied to the tunnel oxide film so that electrons are injected into the floating gate 5 from the substrate 1 through the tunnel oxide film. At this stage, the potential of the floating gate 5 is also controlled by the other control gate, i.e.., the first control gate region 9. Accordingly, when the first control gate region 9 is stored with volatile information in the form of the high potential level of about 5 V, the potential of the floating gate 5 is additionally boosted to higher level so that more electrons are injected into the floating gate 5. On the other hand, when the potential of the first control gate region 9 is held at 0 V, the potential of the floating gate 5 is drawn to the 0 V side such that less electrons are injected into the floating gate 5 from the substrate. Namely, the amount of electrons injected into the floating gate 5 from the substrate 1 can be regulated according to the magnitude of the volatile information written in the first control gate region 9 from the volatile information input terminal 10 by means of the volatile information input gate 12. Since the exchange of electric charge is effected between the substrate 1 and the floating gate 5, the electric charge amount of the first control gate region 9 is almost unchanged. Since the electrons stored in the floating gate 5 do not dissipate to the surrounding insulating layer, the volatile information is converted into the corresponding nonvolatile information. By setting the difference between the maximum and minimum values of the potential temporarily set in the first control gate region 9 to more than 5 V, the amount of change of the injected electrons can be made great according to the volatile information. The nonvolatile information written in the floating gate 5 according to the inventive writing method can be erased by irradiation of ultraviolet ray or by application of a high voltage having a negative polarity to the tunnel oxide film.

Since the floating gate 5 is capacitively coupled to the first control gate region 9 which can memorize volatile information, the nonvolatile writing can be effected by means other than utilizing the tunnel oxide film. For example, under the state that a voltage of 0 V is applied to the source region 2 and a high voltage of more than 5 V is applied to the drain region 3, and that a high voltage of more than 10 V is applied to the second gate 7, when the first control gate region 9 is held at the potential of 5 V, the floating gate 5 is held at relatively high potential level so that the floating gate 5 is injected with a great amount of channel hot electrons generated in the vicinity of the drain region 3. On the other hand, when the first control gate region 9 is held at 0 V, the potential of the floating gate 5 is held at a relatively low level so that the floating gate 5 is injected with only a small amount of the channel hot electrons.

As described above, according to the inventive writing method, the volatile information can be easily and quickly converted into the corresponding nonvolatile information. In order to write a great amount of information at once, the method of utilizing efficient tunnel current is most suitable in view of the small consumption of electric current.

Next, the description is given for the method of reading the written nonvolatile information. Under the state that a constant voltage (for example, 0 V) is applied to the second gate 7 and the first control gate region 9, the channel conductance is monitored in the first semiconductor region 51 formed on a surface portion of the substrate 1 between the source region 2 and the drain region 3 to thereby read the nonvolatile information. Namely, when a great amount of electrons have been injected into the floating gate 5, the semiconductor region 51 is held at a low conductance state. When a small amount of electrons or great amount of positive holes have been stored in the floating gate 5, the semiconductor region 51 is held at a high conductance state.

As described above, according to the present invention, the volatile information inputted from the volatile information input region 10 is easily transferred into the floating gate 5 in the form of the nonvolatile information. Further, by monitoring the channel conductance of the first semiconductor region 51 between the source region 2 and drain region 3, which are different from the volatile information input region 10, the nonvolatile information can be efficiently read out.

In the FIG. 1 embodiment, the first control gate is set to the high potential more than 5 V as the volatile information, hence the corresponding nonvolatile information can be correctly written. Namely, when carrying out the nonvolatile writing, the potential level of the first control gate region 9 has the great influence. Further, since leak current through the insulating film 8 on the first control gate region 9 is extremely small during the nonvolatile writing, the information temporarily written in the first control gate region 9 is stably maintained. Thus, the stable nonvolatile writing can be carried out.

The FIG. 1 embodiment of the semiconductor memory cell has the structure such that the first control gate region 9 is formed in the surface of the substrate 1. In turning to FIG. 2, a switching transistor is formed as a thin film transistor for setting a potential of a first control gate.

Figure 2:
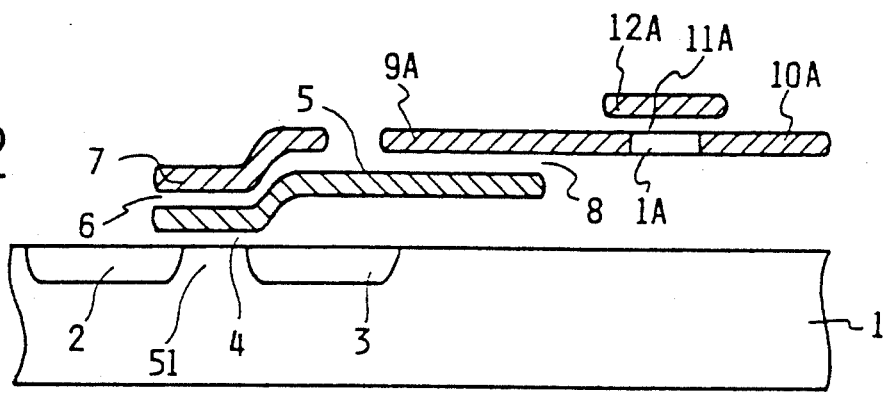
FIG. 2 is a sectional view of another memory cell which constitutes a second embodiment of the semiconductor nonvolatile memory according to the present invention in which the volatile information setting means is comprised of a thin film transistor.

FIG. 2 is a sectional view of a single memory cell of a second embodiment of the inventive semiconductor memory. The switching transistor is comprised of a channel-forming region 1A composed of a thin film made of, for example, polysilicon or monocrystalline silicon. A potential level of a first control gate region 9A is controlled by a potential level of a volatile information input gate 12A and by another potential level of a volatile information input terminal 10A (which has the same function as that of the FIG. 1 volatile information input region 10) so as to write volatile information in similar manner to the FIG. 1 embodiment. In the FIG. 2 embodiment, since the first control gate region 9A is formed of a thin film, the memory cells can be integrated at higher density.

Figure 3:
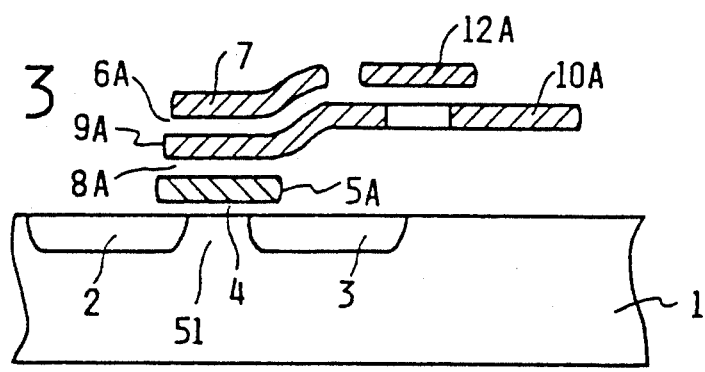
FIG. 3 is a sectional view of still another memory cell which constitutes a third embodiment of the semiconductor nonvolatile memory according to the present invention in which the electric charge storage structure is comprised of a dielectric film.

FIG. 3 is a sectional view of a single memory cell of a third embodiment of the inventive semiconductor nonvolatile memory. In this case, an electric charge storage dielectric film 5A is utilized as nonvolatile storage means. Since the electric charge storage structure is composed of the electric charge storage dielectric film 5A formed of a dielectric film, a first control gate region 9A is formed on the electric charge storage dielectric film 5A through an insulating film 8A as shown in FIG. 3. In similar manner to the FIG. 1 memory, the volatile information is written into the first control gate region 9A, the written volatile information is transferred to the electric charge storage film 5A in the form of corresponding nonvolatile information, and the nonvolatile information is read out by monitoring change of channel conductance of a first semiconductor region 51 between source region 2 and drain region 3.

Figure 4:
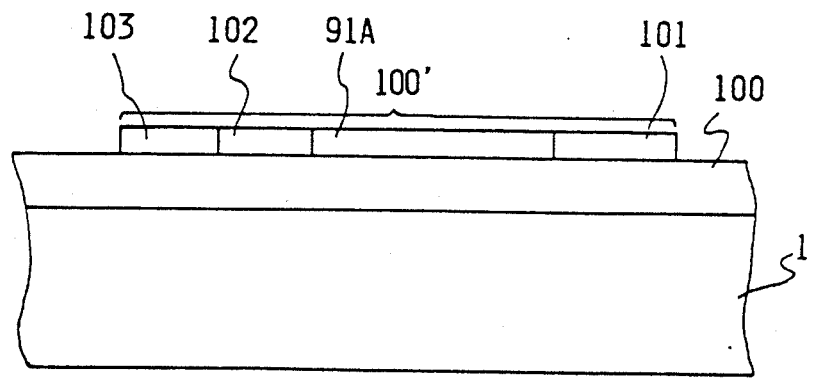
FIG. 4 is a sectional view of a thin film diode utilized as the volatile information setting means.

FIG. 4 is a sectional view showing a fourth embodiment of the inventive semiconductor nonvolatile memory in which a diode is utilized as random-access potential setting means. FIG. 4 shows a structure which acts as the first control gate region 9 and the value information input region 10 shown in FIG. 1 and described above. The memory includes a semiconductor substrate 1 and a field insulating film 100. A polysilicon film 100' is formed on the field insulating film 100. By doping impurity into the polysilicon film 100 ', a first control gate region 91A of N type polysilicon film and P type polysilicon film 101 are formed to constitute a PN diode, and N type polysilicon film 103 and P type polysilicon film 102 are formed to constitute an opposite NP diode. According to a rectifying function of the diodes, the potential level of the first control gate region 91A can be set between 0 V and the power source voltage to write volatile information. The thus set information can be converted into the corresponding nonvolatile information and further the nonvolatile information can be read out in a manner similar to the FIGS. 1–3 memories.

Figure 5:
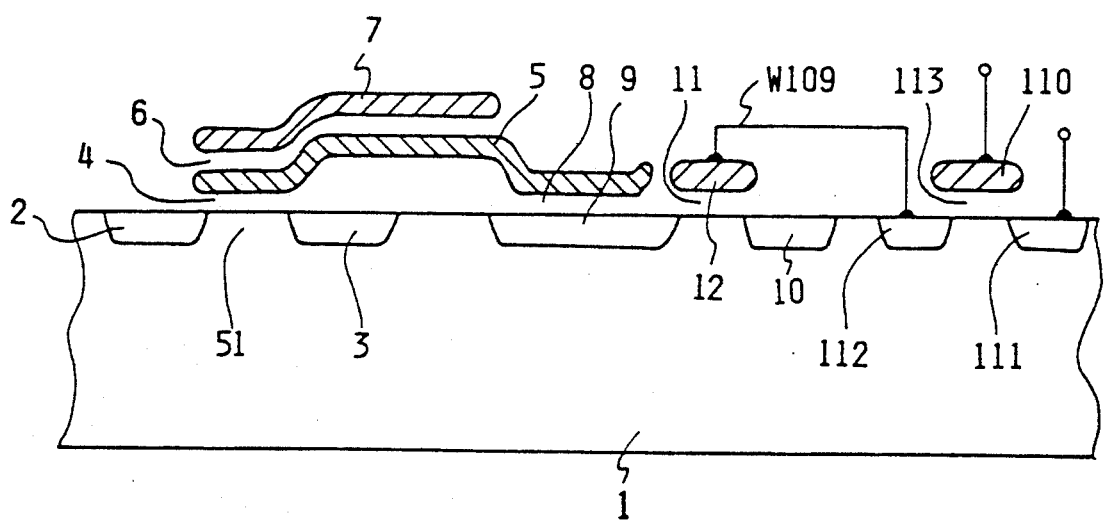
FIG. 5 is a sectional view of still another memory cell which constitutes a fifth embodiment of the semiconductor nonvolatile memory according to the present invention in which the random-access potential setting means is comprised of a transistor.

Next, the description is given for an embodiment in which the random-access potential setting means is provided to the volatile information input gate. FIG. 5 is a sectional view showing a single memory cell of a fifth embodiment of the inventive semiconductor nonvolatile memory. In this embodiment, the volatile information input gate of the FIG. 1 memory type is added with the random-access potential setting means in the form of an additional transistor. N+ type of source region 112 and drain region 111 are formed in a surface portion of P type semiconductor substrate 1. A gate electrode 110 is formed on a surface portion of the substrate 1 between the source region 112 and the drain region 111 through a gate insulating film 113 to constitute a field effect transistor. This transistor can be operated to function as the random-access potential setting means so as to write volatile information by a random-access manner into a volatile information input gate 12. Namely, by applying a voltage more than threshold the voltage to the gate electrode 110 and by selectively applying a voltage of 0 V or a positive voltage of Vs to the drain region 111, the volatile information input gate 12 is set to 0 V through a lead line W109 when the drain region 111 is supplied with 0 V, or the volatile information input gate 12 is set to the positive voltage Vs through the lead line W109 when the drain region 111 is held at the positive voltage Vs. Thereafter, the voltage of the gate electrode 110 is returned to 0 V. By such random-access potential setting means, the volatile information corresponds to a potential applied to the volatile information input gate 12. Then, according to the written volatile information, impedance of a channel region is changed under the volatile information input gate 12. Namely, when the volatile information input gate 12 has an applied potential corresponding to volatile information in the form of the positive potential Vs, the channel region is made conductive and therefore the first control gate region 9 is connected to the volatile information input region 10. Therefore, when a voltage of 0 volt is applied to the volatile information input region 10, the first control gate region 9 is accordingly held at 0 V. On the other hand, when the volatile information input gate 12 has applied a potential corresponding to the volatile information of 0 V, the channel region below the gate 12 has high impedance so that the first control gate region 9 is held at a floating potential. Consequently, by applying a high voltage to the second gate region 7, when the potential of the first control gate 9 is held at 0 V, the potential of the floating gate electrode 5 is drawn to 0 V potential of the first control gate region 9 to thereby suppress rising of the potential of the floating gate electrode so that electrons are not injected into the floating gate electrode 5 from the substrate 1. On the other hand, when the potential of the first control gate region 9 is floating, the potential of the floating gate electrode 5 is boosted sufficiently to a high level by means of the second gate 7 such that electrons are injected into the floating gate electrode 5 from the substrate 1.

As the method of injecting electrons from the substrate 1, the gate oxide film 4 is formed thin at about 100Å, and a potential difference is made zero between the source region and drain region 3. Consequently, a high electric field is applied to the thin gate oxide film 4 to flow tunnel current effective to inject electrons into the floating gate electrode 5.

Alternatively, a high voltage of about 10 V is applied to the drain region 3 and a voltage of 0 V is applied to the source region 2 to generate channel hot electrons in the vicinity of the drain region 3, a part of which is injected into the floating gate electrode 5.

As described above, the random-access potential setting means composed of a transistor is operated to set volatile information, which is subsequently programed into the nonvolatile information. Therefore, an array of the memory can be constructed by matrix having word lines and bit or data lines connected, respectively, to the gate 110 and the drain region 111 of each transistor which constitutes the random-access potential setting means. The volatile information is instantly written into the array by means of the random-access potential setting means, and thereafter nonvolatile information is programed into all memory cells of the array concurrently according to the written volatile information by applying a high voltage to the second control gate of all the memory cells. The embodiments of FIG. 2 and 3 can be also provided with a random-access potential setting means in manner similar to the FIG. 5 embodiment. Further, in the FIG. 5 embodiment, the random-access potential setting means is comprised of a transistor formed in the common substrate; however, the transistor can be formed in a thin semiconductor film disposed on an insulating substrate.

In the aforementioned embodiments, the first and second semiconductor regions are formed on the semiconductor substrate; however, these semiconductor regions 5 can be composed of a semiconductor region of opposite conductivity type formed within the substrate, or these semiconductor regions can be formed of a semiconductor film disposed on an insulating substrate.

Further, when arranging the memory cells in a matrix array, word lines are connected to a gate of the transistors and bit or data lines are connected to a drain of the transistors which constitute the respective random-access potential setting means of the memory cells so as to selectively write volatile information into the respective memory cells. Information written in each memory cell can be selectively read out by connecting the second control gate to the word line and by connecting the second region to the bit line. In some of the array structures, the drain of a transistor of the random-access potential setting means (i.e., the volatile information input region) can be arranged common to the second region.

As described above, according to the present invention, the memory cell is comprised of volatile information generating means composed of a diode or transistor and programing means for programing the volatile information into the electric charge storage structure as the corresponding nonvolatile information. Therefore, the inventive semiconductor memory cell has a simplified structure effective to facilitate construction of high bit arrangement. Moreover, volatile information setting can be carried out instantly at high speed by the random-access potential setting means, and thereafter the volatile information can be programed at once into the corresponding nonvolatile information, thereby achieving the effect of high speed programing of the memory array.

What is claimed is:

1. A semiconductor nonvolatile memory having a plurality of integrated memory cells, each memory cell comprising: a first semiconductor region having a first surface, an electric charge storage structure for storing electric charge and disposed over the first surface with a first insulating film formed therebetween, a first control gate region for controlling the potential of the electric charge storage structure and being electrically coupled through a second insulating film to the electric charge storage structure, a second region electrically connected to the first surface, a second gate disposed over the electric charge storage structure with a third film formed therebetween and electrically coupled to the electric charge storage structure, and random-access potential setting means connected to the first control gate region for setting a random-access potential thereto; whereby the first control gate region nonvolatilely controls the potential of the electric charge storage structure in response to the random-access potential.

2. A method of writing in a semiconductor nonvolatile memory having integrated memory cells, each memory cell comprising a first semiconductor region having a first surface, an electric charge storage structure disposed over the first surface with a first insulating film formed therebetween, a first control gate region for controlling the potential of the electric charge storage structure and being electrically coupled through a second insulating film to the electric charge storage structure, a second region electrically connected to the first surface, a second gate disposed over the electric charge storage structure with a third film formed therebetween and electrically coupled to the electric charge storage structure, and random-access potential setting means connected to the first control gate region, the method comprising the steps of:

temporarily writing volatile information by applying a corresponding given volatile potential to the first control gate region of each memory cell through the random-access potential setting means, and thereafter applying a nonvolatile writing voltage according to a nonvolatile writing instruction to the respective second gate of each memory cell to be written with the information so as to non-volatilely write the information corresponding to the applied volatile potential of the first control gate region into the respective electric charge storage structure of each memory cell.

3. A semiconductor memory cell formed on a substrate comprising:

storage means disposed over the substrate with a first insulating film disposed therebetween for storing electric charge to memorize nonvolatile information;

injecting means for injecting electric charge into the storage means;

first control means electrically coupled to and disposed adjacent to the storage means through a second insulating film and operable to temporarily store volatile information in the form of a potential level effective to control a potential level of storage means;

random access means for setting the potential level of the first control means on a random access basis to temporarily write volatile information into the first control means; and second control means electrically coupled to and disposed adjacent to the storage means with a third insulting film disposed therebetween for applying thereto a control voltage to effect the injection of electric charge from the injecting means to the storage means according to the potential level of the first control means to thereby enable the storage means to memorize nonvolatile information corresponding to the temporarily written volatile information.

4. A semiconductor memory cell according to claim 3; wherein the storage means comprises a floating gate electrode.

5. A semiconductor memory cell according to claim 3; wherein the injecting means comprises a drain region and a source region, and a channel region disposed under the storage means between the drain region and the source region.

6. A semiconductor memory cell according to claim 3; wherein the first control means comprises a gate region disposed under the storage means and capacitively coupled to the storage means.

7. A semiconductor memory cell according to claim 3; wherein the first control means comprises a gate electrode disposed over the storage means and capacitively coupled to the storage means.

8. A semiconductor memory cell according to claim 3; wherein the second control means comprises a gate electrode disposed over the storage means and capacitively coupled to the storage means.

9. A semiconductor memory cell according to claim 3; wherein the random access means comprises input means disposed in spaced relation from the first control means to define therebetween a channel region for inputting volatile information to the first control means through the channel region, and gate means disposed over the channel region for controlling the conductivity of the channel region on the random access basis.

10. A semiconductor memory cell according to claim 9;

wherein the random-access means includes a switching transistor connected to the gate means to effect the random access thereof.

11. A semiconductor memory cell according to claim 9; wherein the input means, the gate means and the first control means are comprised of a thin film transistor.

12. A semiconductor memory cell comprising: volatile memory means for volatilely storing information and comprising a control gate region and random-access potential setting means electrically connected to the control gate region for receiving the information and applying a first potential corresponding thereto to the control gate region; and non-volatile memory means for non-volatilely storing the information and comprising charge storage means for storing a charge and capacitively coupled to the control gate region, gate means for receiving a control voltage and electrically connected to the charge storage means, and injecting means for injecting a charge to be stored into the charge storage means corresponding to a second potential applied to the charge storage means, whereby the second potential is applied to the charge storage means in response to the control voltage received by the gate means and the second potential corresponds to the first potential to thereby effect non-volatile storage of the information in the form of the stored charge.

13. A semiconductor memory cell according to claim 12; wherein the storage means comprises a floating gate electrode.

14. A semiconductor memory cell according to claim 12; wherein the injecting means comprises a drain region and a source region formed in a substrate, and a channel region disposed between the drain region and the source regions.

15. A semiconductor memory cell according to claim 12; wherein the control gate region comprises a gate region disposed under the charge storage means and capacitively coupled to the charge storage means.

16. A semiconductor memory cell according to claim 12; wherein the control gate region comprises a gate electrode disposed over the charge storage means and capacitively coupled to the charge storage means.

17. A semiconductor memory cell according to claim 12; wherein the gate means comprises a gate electrode disposed over the charge storage means and capacitively coupled to the charge storage means.

18. A semiconductor memory cell according to claim 12; wherein the random-access potential setting means comprises input means for receiving the information and disposed in spaced relation from the control gate region to define therebetween a channel region for inputting volatile information to first control gate region through the channel region for controlling the conductivity of the channel region on a random access basis.

19. A semiconductor memory cell according to claim 18; wherein the random-access potential setting means includes a switching transistor connected to the second gate means to effect the random access thereof.

20. A semiconductor memory cell according to claim 18; wherein the input means, the second gate means and the control gate region jointly comprise a thin film transistor.

21. A method of storing information nonvolatilely in a memory cell, comprising the steps of: volatilely storing information by supplying the information to a random-access potential setting means, and applying by the random-access potential setting means a first potential corresponding to the information to a control gate region; and non-volatilely storing the information by applying a control voltage to a gate means to apply a second potential to a charge storage means to inject a charge into the charge storage means by an injecting means, whereby the second potential corresponds to the first potential and the injecting means injects a charge into the charge storage means which corresponds to the second potential to thereby effect non-volatile storage of the information in the form of the stored charge.

* * * * *